US012379955B1

(12) United States Patent
Ware

(10) Patent No.: US 12,379,955 B1
(45) Date of Patent: Aug. 5, 2025

(54) STALL-DRIVEN MULTI-PROCESSING

(71) Applicant: Rambus Inc., Sunnyvale, CA (US)

(72) Inventor: Frederick A. Ware, Los Altos Hills, CA (US)

(73) Assignee: Rambus Inc., San Jose, CA (US)

( * ) Notice: Subject to any disclaimer, the term of this patent is extended or adjusted under 35 U.S.C. 154(b) by 204 days.

(21) Appl. No.: 16/844,969

(22) Filed: Apr. 9, 2020

Related U.S. Application Data

(60) Provisional application No. 62/837,127, filed on Apr. 22, 2019.

(51) Int. Cl.
| | |
|---|---|
| *G06F 9/48* | (2006.01) |
| *G06F 9/46* | (2006.01) |
| *G06F 9/50* | (2006.01) |
| *G11C 11/409* | (2006.01) |

(52) U.S. Cl.
CPC .............. *G06F 9/461* (2013.01); *G06F 9/46* (2013.01); *G06F 9/462* (2013.01); *G06F 9/48* (2013.01); *G06F 9/4806* (2013.01); *G06F 9/4812* (2013.01); *G06F 9/4843* (2013.01); *G06F 9/485* (2013.01); *G06F 9/4881* (2013.01); *G06F 9/50* (2013.01); *G06F 9/5083* (2013.01); *G11C 11/409* (2013.01)

(58) Field of Classification Search
CPC ........ G06F 9/48; G06F 9/4806; G06F 9/4812; G06F 9/4843; G06F 9/485; G06F 9/4881; G06F 9/50; G06F 9/5083
See application file for complete search history.

(56) References Cited

U.S. PATENT DOCUMENTS

| | | | |
|---|---|---|---|
| 5,361,337 A | 11/1994 | Okin | |
| 6,694,347 B2 | 2/2004 | Joy et al. | |
| 9,384,036 B1* | 7/2016 | Barroso | ................ G06F 9/3851 |
| 9,710,303 B2 | 7/2017 | Solihin | |
| 2003/0163675 A1* | 8/2003 | Bennett | ................ G06F 9/3824 |
| | | | 712/228 |
| 2004/0153634 A1* | 8/2004 | Barry | .................. G06F 15/8007 |
| | | | 712/228 |

(Continued)

FOREIGN PATENT DOCUMENTS

EP          1185939          9/2003

OTHER PUBLICATIONS

Kamruzzaman et al, "Inter-core Prefetching for Multicore Processors Using Migrating Helper Threads", ASPLOS'11, Mar. 5-11, Newport Beach, California, USA.2011, ACM, pp. 393-404 (Year: 2011).*

*Primary Examiner* — Charles M Swift
(74) *Attorney, Agent, or Firm* — Charles Shemwell

(57) ABSTRACT

In a microprocessor having an instruction execution unit and first and second sets of process execution resources, context information for a process next-to-be-executed by the instruction execution unit is loaded into a register file, translation lookaside buffer and first-level data cache of the first set of process execution resources during a first interval. During the first interval and concurrently with the loading of context information for the process next-to-be executed, the instruction execution unit executes a current process, including accessing context information for the current process within the register file, translation lookaside buffer and first-level data cache of the second set of process execution resources.

21 Claims, 4 Drawing Sheets

(56) References Cited

U.S. PATENT DOCUMENTS

| | | | |
|---|---|---|---|
| 2007/0113044 A1* | 5/2007 | Day | G06F 12/1027 |
| | | | 711/207 |
| 2010/0125722 A1* | 5/2010 | Hickey | G06F 9/461 |
| | | | 712/228 |
| 2015/0301953 A1* | 10/2015 | Bybell | G06F 12/1027 |
| | | | 711/207 |
| 2017/0351520 A1* | 12/2017 | Tran | G06F 9/3838 |
| 2018/0285374 A1* | 10/2018 | Koker | G06F 9/3836 |
| 2019/0377607 A1* | 12/2019 | Dubeyko | G06F 12/1027 |

* cited by examiner

STALL-DRIVEN MULTI-PROCESSING

CROSS REFERENCE TO RELATED APPLICATIONS

This application hereby claims priority to and incorporates by reference U.S. Provisional Application No. 62/837,127 filed Apr. 22, 2019.

TECHNICAL FIELD

The present disclosure relates generally to data processing and more particularly to process scheduling.

DRAWINGS

The various embodiments disclosed herein are illustrated by way of example, and not by way of limitation, in the figures of the accompanying drawings and in which like reference numerals refer to similar elements and in which.

Figure 5:
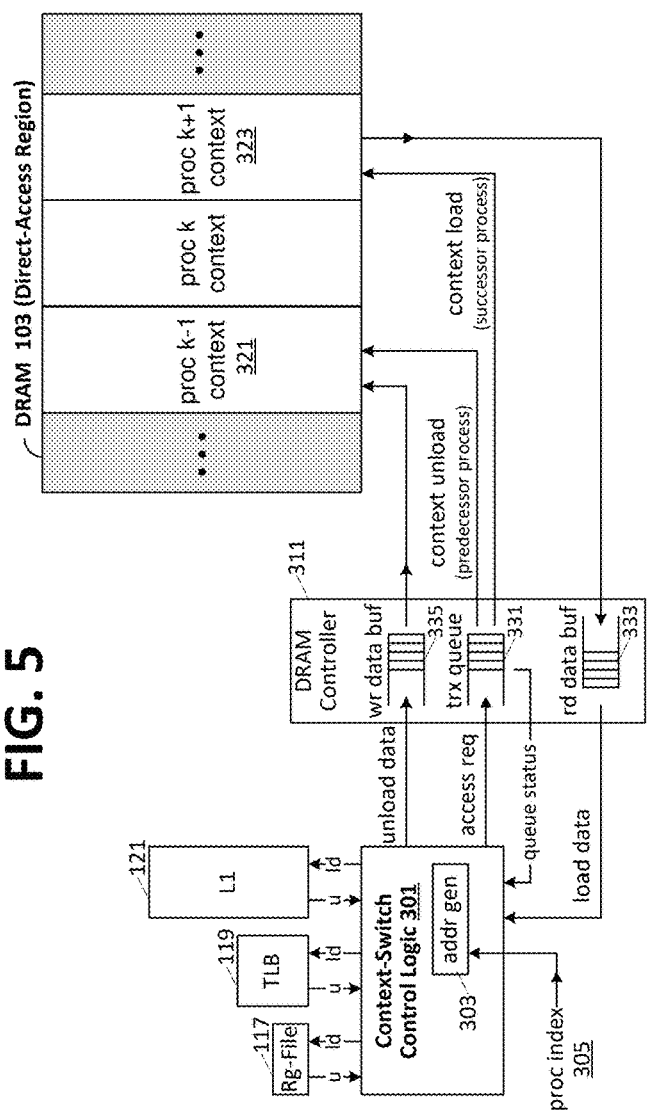
Figure 4:
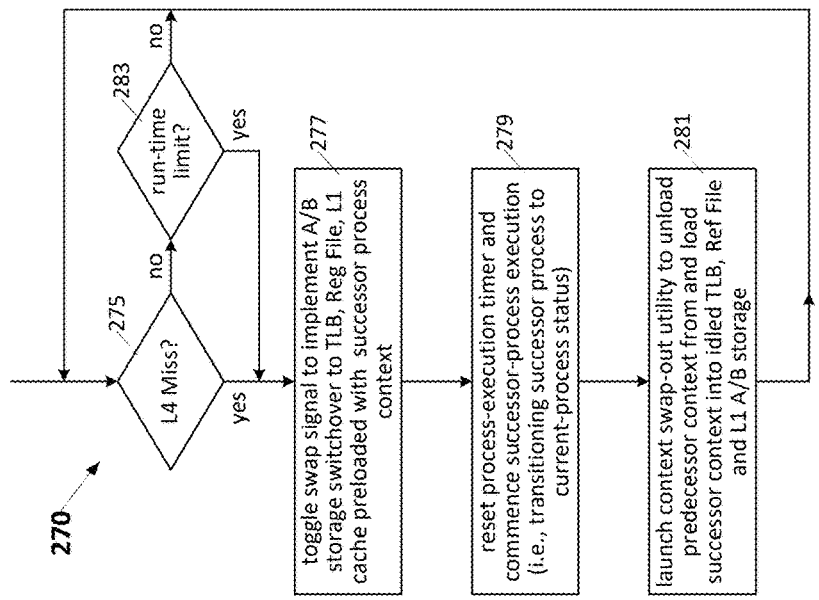

FIG. 4 is a flow diagram of exemplary operations carried out by the context-switch control logic to effect process switch-over in response to long-latency stall events, and more specifically (in the depicted example) in response to misses in the L4DRAM cache; and FIG. 5 illustrates a context-switch control logic embodiment that executes context unload and pre-load operations with respect to shadow storages of local memory resources—register file, TLB and L1 cache in the depicted example, though additional resources (L2 and L3 caches for example) may be shadowed and thus unload/pre-loaded.

DETAILED DESCRIPTION

In various embodiments herein, a processor transitions between process contexts upon encountering instructions that stall process execution pending completion of long-latency memory access, switching over from a first set of local storage resources containing context of the current, to-be-suspended process to a second set of local storage resources that have been pre-loaded with context of the next-to-be-executed, successor process. After switchover from the first set of local storage resources to the second set, context unload/pre-load operations are carried out concurrently with execution of the successor process (which has become the "current" or "live" process) to copy or "unload" the context of the suspended (now-predecessor) process from the first set of local storage resources to a context memory resource and to load context of a next-to-be executed (successor) process from the context memory resource into the first set of local storage resources. Thereafter, upon encountering an instruction that stalls the current (formerly successor) process pending completion of a long-latency memory access, the processor transitions from the current process context to the context of the process next to be executed through switchover from the second set of local storage resources to the first set of local storage resources. During execution of the successor/now-current process, context from the predecessor/previously-live process is unloaded from the second set of local storage resources (copied into the context memory resource) and context from the next-to-be executed/new-successor process is loaded.

Figure 1:
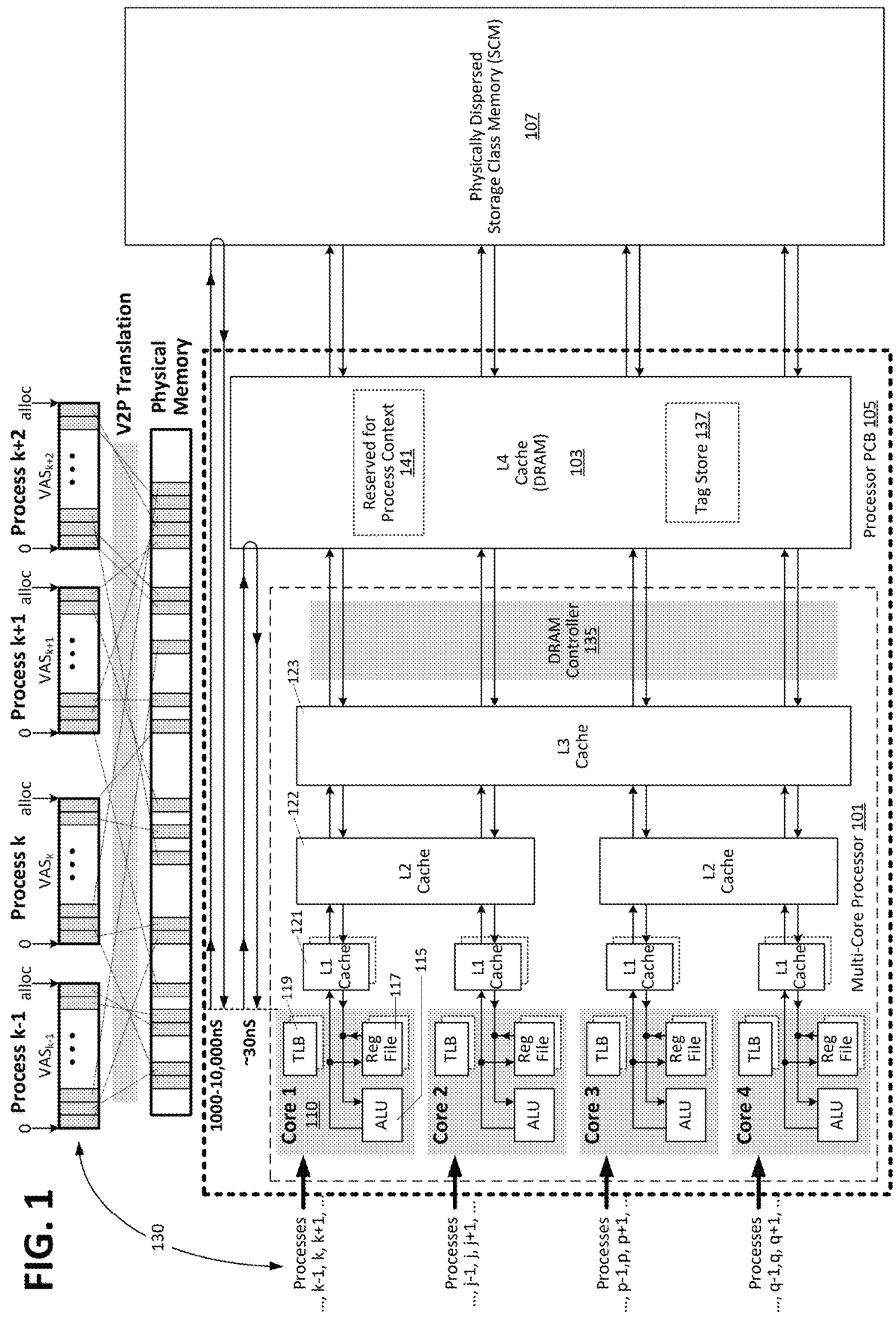
FIG. 1 illustrates an embodiment of a computing system that implements stall-driven multiprocessing—switching between processes having respective virtual address spaces in response to long-latency memory access events.

FIG. 1 illustrates an embodiment of a computing system 100 that implements stall-driven multiprocessing—switching between processes having respective virtual address spaces in response to long-latency memory access events. In the embodiment shown, a multi-core processor 101 and DRAM (dynamic random access memory) storage 103 are mounted on a printed circuit board 105 (the "processor board") and interconnected through one or more off-board switching structures (not shown in FIG. 1) with a physically-dispersed storage class memory. In a number of embodiments, for example, processor board 105 may be disposed in a server rack within a data center, the server rack being one of many thousands of floor-plan-distributed server racks, with each individual rack having any number of processor boards (including zero processor boards in some storage-only instances) and any number of storage class memory boards. In a symmetric interconnect environment, a storage class memory access may be directed from processor 101 to essentially any storage class memory board within the data center, with access requests and data propagating through various cross-bar interconnect structures to provide switched access from processor 101 to storage class memory 107 located in any server rack row/column coordinate within the data center and at any position within the server rack—in effect a three-dimensional access coordinate that may resolve to a storage class memory tens or hundreds of meters or more from the requesting processor and thus incur substantial round trip latency delay on top of the latency of the storage class memory itself. In a number of embodiments, occurrence of such long-latency accesses (generally on the order of 1 μS-10 μS depending on round-trip latency and storage class memory speed) is minimized by leveraging the local on-processor-board DRAM instantiation 103 as a cache memory—a level 4 (L4) cache memory in the FIG. 1 embodiment, with progressively smaller and faster L3, L2 and L1 cache memories being implemented within multicore processor 101.

The exemplary multicore processor 101 shown in FIG. 1 includes four processor cores 110 (more or fewer processor cores may be implemented in alternative embodiments, including single-core implementations), with each core having an arithmetic logic unit (ALU) 115, register file 117 and translation-lookaside buffer (TLB) 119. A relatively small L1 cache 121 is dedicated to each processor core (L1 per core), while a larger L2 cache 122 is shared by pairs of processor cores and a yet larger L3 cache is shared by all processor cores 123 (various other core-to-cache architectures may be implemented). Each processor core 110 generally includes various other functional components not specifically shown including, for example, a memory management unit (constituted in part by TLB 119) that translates virtual addresses within the virtual address space allocated to a given process to physical addresses that resolve to locations within the physical memory hierarchy (e.g., as shown by the exemplary per-process virtual-to-physical (V2P) address mapping at 130). Each core may also include context-switch control logic, as discussed below, though such logic may also be shared between the multiple cores or subsets thereof.

Data requested during execution of a given process is generally sought first within register file 117 before progressing (in the case of a register-file miss) to the L1 cache, L2 cache, L3 cache and finally the L4 cache, before resorting to off-board access to storage class memory 107. Each miss within a given resource (failure to find the requested data) triggers progression to the next-level resource—enerally a larger, higher-latency and physically more distant storage and thus a progressively slower access at each hierarchical level of physical memory. In the case of an L4 cache access (triggered by an L3 miss), a DRAM controller 135 (i.e., a functional circuit block within the processor) accesses a tag store 137 and corresponding data within the L4 DRAM (off-chip) cache—a two-phase transaction involving a relatively high-latency row activation and subsequent column read-out that collectively require on the order of 30 nanoseconds. By contrast, an L4 cache miss requires off-board access to storage class memory 107, incurring an access time penalty several orders of magnitude longer than the L4 access time (i.e., 1,000 to 10,000 nS as discussed above) and thus a process stall time not easily bridged by conventional multithreading techniques (e.g., switching between threads operating within the same virtual space as may be done to bridge conventional 20-60 ns DRAM access latency). Further, because the contents of TLB 119 and much (or most or all) of the contents of L1 cache 121 are process specific, simply switching processes while those resources are loaded with contents pertaining to the prior process will result in a flood of TLB/L1 misses—events likely to propagate through to the L4 cache at least (i.e., missing in L2 and L3) and thus incur hundreds or thousands (or more) L4 access-time penalties.

In the FIG. 1 embodiment, the extreme latency penalty of an L4 miss within a given process (e.g., a 1 µS to 10 µS stall represents a lost opportunity to execute thousands or tens of thousands of instructions at state of the art core instruction-execution rates) is mitigated by switching to a successor process in response to the L4 miss (or, more generally, in response to a long-latency access to storage class memory, off-board resource access or other long-latency event) and simultaneously re-routing/re-directing local resource access paths to alternative local memory resources that shadow those in use by the stalled process and that have been pre-loaded with context of the successor process. Through this approach, the successor (now current) process may commence execution with local memory resources in the same or approximately the same state as when that process was last switched out—that is, the register-file, TLB and L1-cache hit rates will generally match those prior to process switch-out (i.e., as their content is the same or essentially the same as prior to process switch-out), avoiding the high miss-rate and resulting longer-latency access penalties that generally accompany process switchover. As the newly launched (or re-commenced) process executes, the prior-process context within the local memory resources rendered to the background at process switch (the "swapped-out" resources) is unloaded to a reserved region 141 of the on-board DRAM (part of the DRAM subsystem reserved for context storage rather than allocated to L4-cache tag/data storage) followed by pre-load of those same local memory resources with successor-process context, thus making ready for stall-based and/or schedule-based transition to the next-to-be-executed process.

Figure 2:
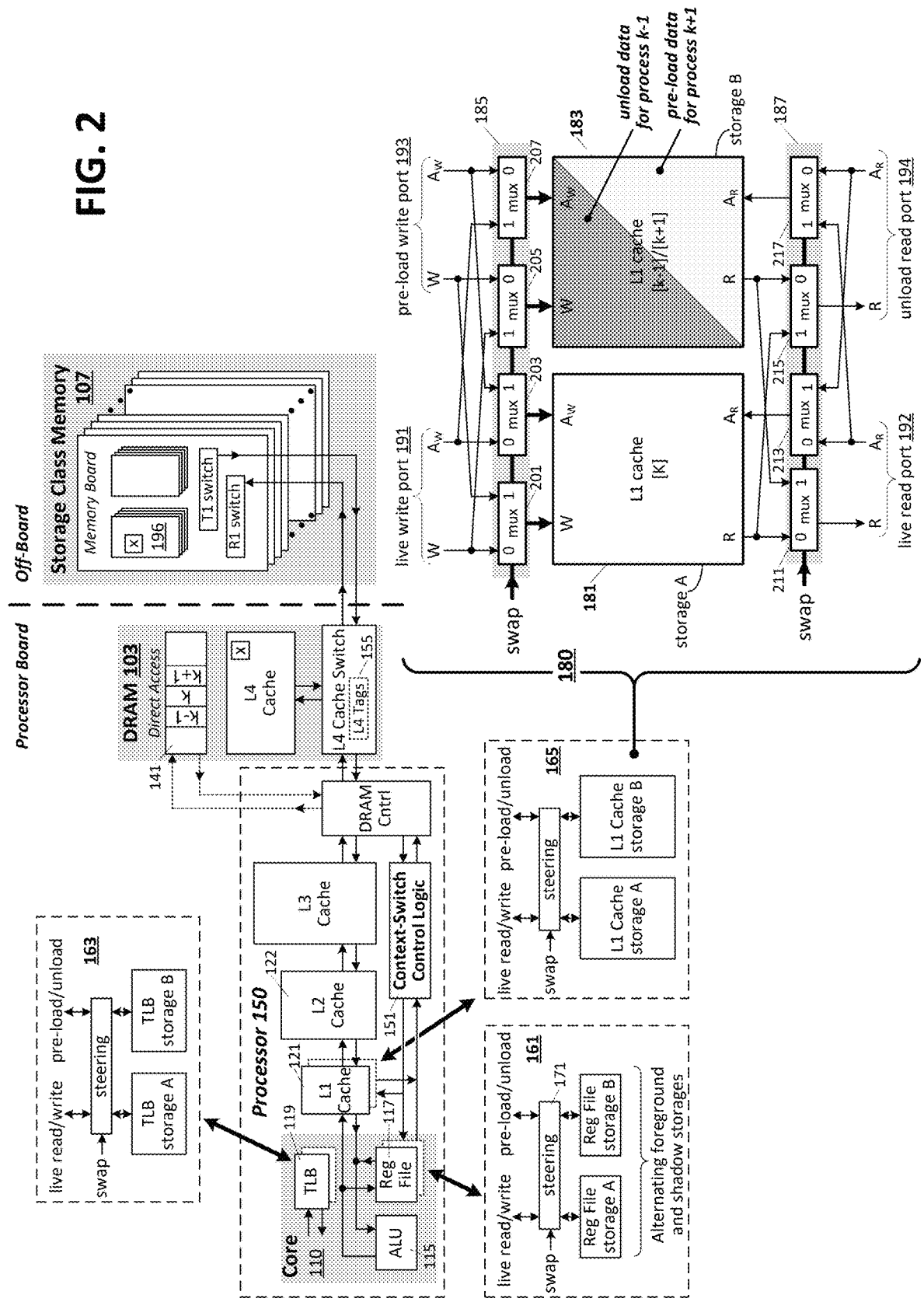
FIG. 2 illustrates a more detailed embodiment of the shadowed local memory resources and interconnect ports thereto provided to support process switch-over upon long-latency process-stall as well as predecessor/successor context unload/pre-load operations after process switch-over.

FIG. 2 illustrates a more detailed embodiment of the shadowed local memory resources shown in FIG. 1 and interconnect ports thereto provided to support process switch-over upon long-latency process-stall as well as predecessor/successor context unload/pre-load operations after process switch-over. For ease of illustration, only a single core of FIG.1 processor 150 is depicted, though additional cores may be present and share any or all of the depicted resources. A per-core context-switch control logic element 151 is provided within the processor (which may have multiple cores despite single-core depiction) and coupled to access ports within register file 117, TLB 119 and L1 cache 121 (collectively referred to herein as "local memory resources"). Upon detection of an L4-miss or other long-latency stall event (e.g., signaled by core 110 in response to failure to find an address match within the L4 tag store at 155), core 110 notifies/signals context-switch control logic 151 of the impending process-stall. The context-switch control logic, in response, toggles a resource "swap" signal (e.g., from low to high or high to low) to reverse the connection of read/write ports process within each of the local memory resources, re-routing those ports from the storage resource for the stalled process (within the register file, TLB and L1 cache, at least) to alternate (shadow) resources that have been pre-loaded with context for the successor process. In one embodiment, register file 117 includes an instruction pointer, stack pointer and other context required for execution of the successor process so that toggling the resource swap signal implements the switchover from the stalled process to the successor process (now the current or live process) with the core commencing fetch and execution of instructions for the newly launched or revived process through reference to the instruction pointer, stack pointer, etc. in the newly foregrounded register file storage.

Still referring to FIG. 2, each of the local memory resources—register file 117, TLB 119 and L1 cache 121 in this example—includes live-process read/write ports (which in each case may be implemented by separate unidirectional read and write ports or by a single shared bidirectional port) and pre-load/unload ports (also implemented by either separate or shared ports) coupled to symmetric storage resources A and B via an access-steering circuit—that is, a "dual-port" storage resource that may be accessed concurrently by two distinct read/write requestors. Referring to detail view 161 of register file 117, for example, steering circuit 171 couples the live-process read/write port(s) to either register-file storage A or register-file storage B according to the state of the swap signal ("swap") and couples the pre-lad/unload port(s) to the alternate register-file storage (A or B whichever is not accessed by the live read/write port(s) for a given state of the swap signal). Accordingly, when the swap signal is in a first state (e.g., logic low or '0') read and write access requests from the live process (i.e., via the live read/write port(s)) are directed to register file storage A (storage A is the foreground storage), while read and write accesses from a swap-out manager within the context-switch control logic are directed to register file storage B, the shadow storage. At process switchover, the swap signal is toggled to the alternate state (e.g., from logic '0' to logic '1') to multiplex the live read/write and context load/unload ports to the alternate storages, reversing the foreground/shadow status of those storages such that live read and write accesses are directed to register file storage B (now the foreground storage) and context unload/load accesses are directed to register file storage A (now the shadow storage). The dual-storage/dual-port architecture of the register file is replicated within the TLB and L1 cache as shown at 163 and 165, albeit with different size storage arrays potentially implemented by different underlying storage cell technologies. In all cases, shadow storages may be provided within other on-chip cache structures (e.g., L2 and L3 caches) with multiplexing circuitry provided in connection therewith and unload/pre-load operations carried out to unload predecessor process context and pre-load successor process context into those storages.

A more detailed embodiment of the dual-storage/dual-port L1 cache 121 (or 165) is shown at 180. In this example, each of the alternate L1 storage arrays, 181 (A) and 183 (B), is itself dual-ported, having a dedicated write access port (W for write data, $A_W$ for write address) and read-access port (R for read data, $A_R$ for read address) with separate multiplexing structures 185 and 187 (collectively forming the steering circuitry discussed above) coupled between the write-side and read-side live-access and unload/load access interfaces (ports). More specifically, write access from the live/current process is effected via write-data and address inputs W and $A_W$ that constitute "live write port" 191 and are switchably coupled to either the write-data/address inputs of storage 181 or storage 183 (i.e., via multiplexers 201, 203, 205 and 207) according to the swap signal state—directing live write-data/write address to storage A if the swap signal is low and to storage B if the swap signal is high. Conversely, successor-process pre-load (write) access from the context-switch control logic is implemented via pre-load write port 193, passing through multiplexers 201 and 203 to the write-data/address inputs of storage A (181) if the swap signal is high and through multiplexers 205 and 207 to the write-data/address inputs of storage B (183) if the swap signal is low. Read data and read-address components (R and $A_R$) of live read port 192 and unload read port 194 (the latter for unloading the predecessor process context) are similarly coupled alternately to the read-data output/read-address input of storage A and storage B via multiplexers 211, 213, 215 and 217, with live-read access to storage A (181) and unload access to storage B (183) if the swap signal is low and live-read access to storage B and unload access to storage A if the swap signal is high. By this arrangement, the current process has unfettered read and write access to the L1 cache (storage A or storage B, as the case may be), while the context-switch control logic unloads the predecessor process context from the backgrounded storage/shadow storage (A or B) and then pre-loads the successor context into that storage.

In a number of embodiments, context-switch control logic 151 includes a data transfer engine or state machine that unloads and pre-loads context (of predecessor and successor processes, respectively) without requiring processor intervention aside from initial programming of addresses within the off-chip DRAM 103 allocated/reserved for context storage (e.g., region 141). Thus, context-switch control logic may carry out a direct memory access operation (or the like) to retrieve predecessor-process context from the backgrounded resource storage (i.e., whichever of the register-file, TLB and L1 cache storages is not in use by the live process) and write that context to the pre-allocated DRAM storage area (141), and conversely to retrieve successor-process context from the pre-allocated DRAM region and write that context to the backgrounded resource storage. In other embodiments, a thread may be executed in conjunction with the live process to carry out (or assist the context-switch control logic) with the context unload/pre-load operations. In either case, unload and pre-load operations are generally carried out non-obtrusively (e.g., during resource idle intervals) so as to avoid resource conflicts (e.g., to DRAM 103) and thus have little or no performance impact on live process execution. In a number of embodiments, the urgency—and thus the permissible level of live-process interference—for completing unload/preload may be progressively raised during the execution time of a given process to avoid starving unload/pre-load operations to the point of unreadiness for stall-based switchover. Further, the order in which local memory resources are unloaded/pre-loaded may be specified process by process (e.g., programmed within an unload/pre-load data object available to the context-switch control logic), generally defaulting to register-file first, followed by TLB and then L1 cache.

Still referring to FIG. 2, switch elements "T1" and "R1" within storage class memory 107 implement the first nodes of a multi-tiered memory communications network—the switches will forward physical memory requests and write data to storage class memory resources 196 (e.g., Flash memory, disk, etc.), and return physical memory data and status from those resources according to a standardized or proprietary transaction protocol (e.g., a split-transaction protocol that can tolerate long access latencies but still maintain high transaction bandwidth). This arrangement allows the storage class memory capacity to be very large, albeit with correspondingly large access latency (owing to both size and storage technology). As discussed above, the large access latency in combination with the large transport latency (e.g., traversing data center or other long-haul interconnect) yields an overall access latency generally in the thousands of nanoseconds—a latency hidden by the context switch and shadow-resource unload/pre-load operations presented herein.

Referring to FIGS. 1 and 2, the L4 cache miss rate may be modeled through knowledge of mean instruction-execution rate (average time per instruction execution without accounting for stall due to L4 miss) and statistical estimation of miss rates in the register file, TLB and L1-L4 caches. In a nominal estimation for a multi-gigahertz processor that fetches/executes an instruction approximately once per nanosecond (i.e., after accounting for local resource access, etc.), and assuming an 80% hit rate (20% miss-rate within each of the register file, L1, L2 L3 and L4 caches), L4 misses will occur approximately once every 3000 instructions and thus approximately every 3 µS. In one embodiment, the context swap-out (time required to unload and archive predecessor process context and to retrieve and pre-load successor process context) is managed by the context switch control logic so as to complete within a predetermined fraction of the statistically likely L4 miss-rate—for example in one-third of the time between T4 misses, and thus within a 1 µS interval in a system estimated to average 3 µS between L4 miss events—shorter or longer target unload/pre-load times may be achieved in accordance with application needs and/or programmed policy settings.

Figure 3:
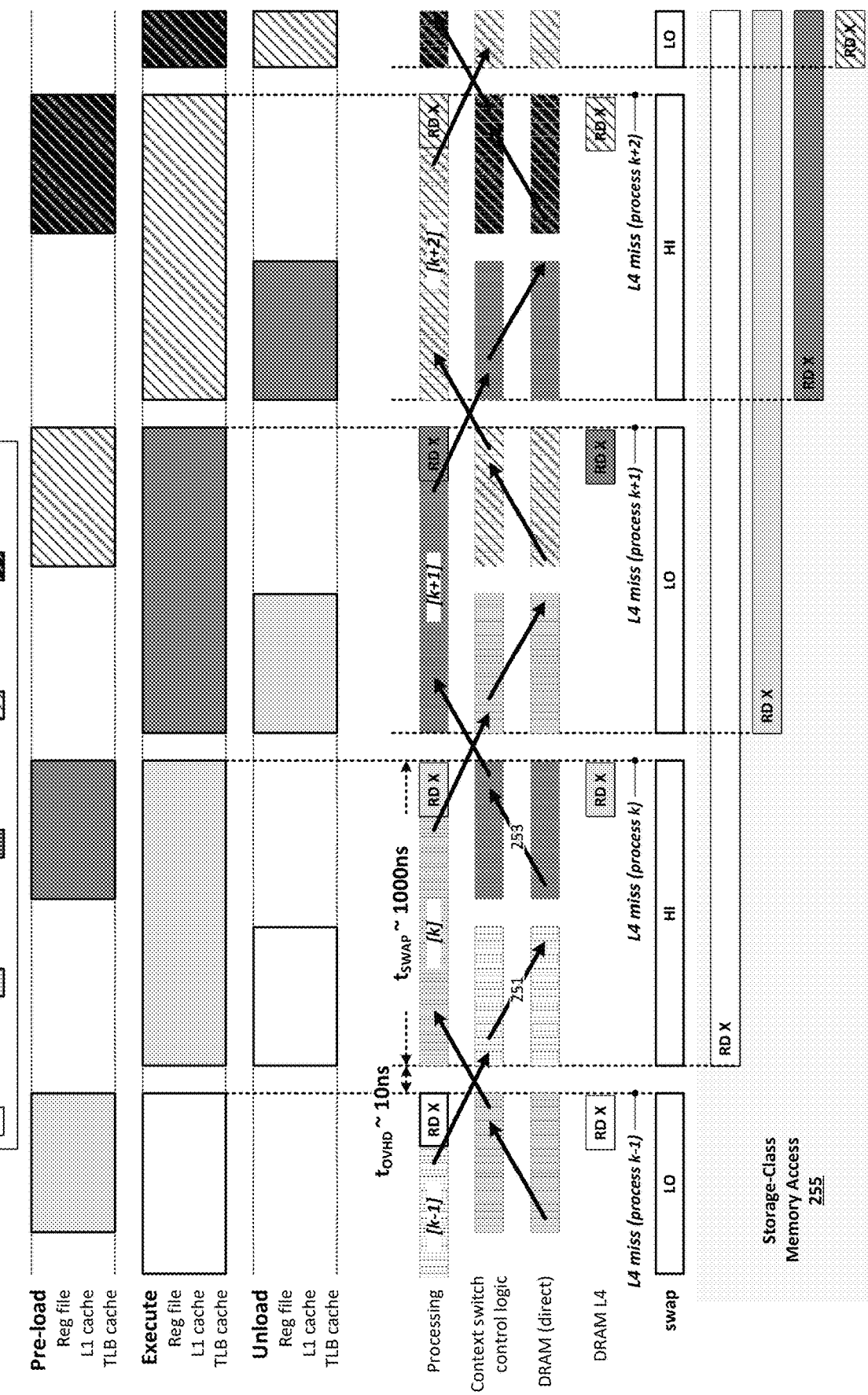
FIG. 3 illustrates an exemplary timing diagram corresponding to a system in which the context swap-out (unload and pre-load) are completed in ~1 μS and, for the sake of diagram simplicity, in which an L4 miss occurs immediately after context swap-out is completed.

FIG. 3 illustrates an exemplary timing diagram corresponding to a system (i.e., as shown generally in FIGS. 1 and 2) in which the context swap-out (unload and pre-load) are completed in ~1 µS and, for the sake of diagram simplicity, in which an L4 miss occurs immediately after context swap-out is completed (e.g., by Context-Switch Control Logic 151). Operations specific to individual processes (k−1, k, k+1, k+2, k+3, . . . ) are denoted by shading and/or cross-hatching in accordance with the legend at 231. As the diagram demonstrates, operations corresponding to different processes are pipelined (overlapping in time), with local-resource pre-loading (e.g., register file 117, TLB 119, L1 cache 121 as shown in FIGS. 1 and 2) within process k concurrently with execution of process k−1. Upon encountering an L4 miss—denoted in the processor execution timeline by a "RD X" instruction in the process k−1 "Processing" timeline—the processor core switches over to execution of process k, toggling the swap signal so that the pre-loaded process-k context becomes immediately available and incurring a relatively negligible process-switch overhead, $t_{OVHD}$ (e.g., ~10 nS). During the initial and latter phases of the process k execution interval (shown as $t_{SWAP}$), the context for predecessor process k−1 is unloaded and the context for successor process k+1 is loaded, respectively. These operations are shown with respect to the context-switch control logic and direct DRAM access timelines (i.e., to the process context storage) at 251 and 253. That is, the context-switch control logic transfers predecessor context from the backgrounded local resources to the off-chip DRAM store ("DRAM direct") during an initial portion of the process-k execution interval and transfers successor-process context from the DRAM store to the local resources during a later portion of the process-k execution interval, thereby making the shadow resources ready for immediate swap to foreground (accessible to live process) at the next L4 miss. As shown, the pre-load/execution/unload pipeline continues through processes k−1, k, k+1, k+2, k+3 and so forth, rotating through the process queue, with newly launched processes being inserted into the queue and completed processes being evicted from the queue.

Still referring to FIG. 3, accesses to storage class memory are time-staggered according to their time of commencement and otherwise proceed concurrently as shown at 255. Note that the continuous-bar depicted each individual process at 255 represents the latency of each individual storage-class memory access—an access that includes a relatively brief transmission of a memory request packet (and write data packet) and correspondingly brief reception of memory data packet (and status packet) after a long propagation interval. The transmit and receive links (of the memory communications network) will fill in the network nodes with packets for other accesses to maximize throughput.

FIG. 4 is a flow diagram 270 of exemplary operations carried out by the context-switch control logic to effect process switch-over in response to long-latency stall events, and more specifically (in this example) in response to misses in the L4 DRAM cache. As shown, upon detecting an L4 miss (affirmative determination at 275), the context-switch control logic toggles the swap signal at 277 to implement a foreground/background switchover with respect to local memory resources-more specifically, switching the foreground storage resources (A or B) within the TLB, register file and L1 cache to shadow status for context unload/pre-load and switching the pre-loaded shadow storage resources (B or A) within the TLB, register file and L1 cache to foreground status for live process access. At 279, the context-switch control logic resets a process execution timer and signals the processor to commence process execution (i.e., making the successor process the live process), and at 281, the context-switch control logic launches a context-swap out utility (e.g., data transfer engine/state machine as discussed above) to unload predecessor-process context from the backgrounded TLB, register-file and L1 cache storage resources and then pre-load context for the successor process into those storage resources.

Still referring to FIG. 4, in absence of an L4 miss (negative determination at 275), the context-switch control logic compares the process-execution timer against a continuous run-time limit for the subject process at 283 to determine whether to trigger a schedule-based process switch-over. In one embodiment, for example, each process is allocated a run-time slice within a process rotation cycle (time by which all launched and unterminated processes are to have executed to at least some degree), with a "run-time limit" value corresponding to that run-time slice being recorded within a lookup table (or uniform across processes or process categories, or analytically determinable) and accessible for comparison with the process-execution timer. If the context-switch control logic determines that the run-time limit has been reached or exceeded (affirmative determination at 283), the context-switch control logic executes a process switch over generally in the same manner as in the case of an L4 miss—executing the operations at 277, 279 and 281. Note that the operations at 277 and 279 may be executed concurrently or in reverse order of that shown.

FIG. 5 illustrates a context-switch control logic embodiment 301 that may be used to implement the context-switch control logic 151 shown in FIG. 2 and that executes context unload and pre-load operations with respect to shadow storages of local memory resources (register file 117, TLB 119 and L1 cache 121 in the depicted example). As shown, context-switch control logic 301 is coupled to the unload and pre-load ports ('u' and 'ld') of the shadow storages and includes an address generator 303 that generates process-indexed addresses of context archive regions within off-chip DRAM 103. Thus, upon switchover to a new process, the process index 305 (e.g., 'k') supplied to address generator 303 enables generation of DRAM addresses corresponding to the predecessor process (k−1) for purposes of context unload, and then generation of DRAM addresses corresponding to the successor process (process k+1) for context pre-load. During context unload, context-switch control logic 301 reads out predecessor-process context from the shadow TLB, register file and L1 cache storage elements, and supplies that context ("unload data") to DRAM controller 311 together with a write access request bearing the corresponding archive address for process k−1. The DRAM controller, in turn, issues memory-write commands and corresponding address values to transfer the unload data to the appropriate context archive region (e.g., 321 for process k−1 context). Context pre-load is essentially the reverse of the unload, with the context-switch control logic issuing read access requests to DRAM controller 311 together with corresponding address values corresponding to the successor process context. The DRAM controller, in response, issues memory read commands and corresponding address values to retrieve successor-process context (i.e., from region 323), queuing the "load" data into a read buffer for eventual return to the context-switch control logic. The context-switch control logic forwards load data to the appropriate shadow storage via the pre-load port, thereby pre-loading the resource with successor-process context.

In one embodiment, context-switch control logic 301 monitors the status of a transaction queue 331 within DRAM controller 311 (e.g., by snooping a host request bus, receiving status from the DRAM controller and/or receiving information from the core regarding memory access requests) to identify intervals of relative inactivity (i.e., entirely empty transaction queue or limited number of time-critical access requests/read requests pending, with read and write data buffers 333, 335 likewise being empty or relatively empty) in which to submit unload/pre-load access requests—that is, context-switch control logic 301 submits unload/pre-load access requests to DRAM controller 311 (which may otherwise be busy carrying out L4 access requests) opportunistically and with no or negligible disruption of DRAM access requested by live processes. In a number of embodiments, the context-switch control logic more aggressively requests unload/pre-load DRAM access as the execution time of the current process extends, for example by adjusting the relative inactivity threshold (transaction queue depth) to be met before submitting access requests. For example, upon initial switchover to a given process, context-switch control logic 301 may only issue DRAM access requests upon determining that transaction queue 331 is free (or has a relatively low number) of pending read requests, whereas later in the execution of that same process (e.g., as the statistical mean-time for L4 miss draws nearer), context-switch control logic 301 may issue DRAM access requests despite the presence of a nonzero (threshold) number of pending read requests, raising that policy-programmable threshold has time goes by, and eventually issuing unload/pre-load access requests regardless of pending transactions.

The various circuits and component architectures disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits can be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image can thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any of the specific core memory types, relative storage sizes, access time latencies, signaling protocols and the like can be different from those described above in alternative embodiments. Additionally, links or other interconnection between integrated circuit devices or internal circuit elements or blocks may be shown as buses or as single signal lines. Each of the buses may alternatively be a single signal line, and each of the single signal lines may alternatively be buses. Signals and signaling links, however shown or described, may be driven with single-ended or differential signals. Integrated circuit device "programming" can include, for example and without limitation, loading a control value into a register or other storage circuit within the integrated circuit device in response to a host instruction (and thus controlling an operational aspect of the device and/or establishing a device configuration) or through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. A signal driving circuit is said to "output" a signal to a signal receiving circuit when the signal driving circuit asserts (or deasserts, if explicitly stated or indicated by context) the signal on a signal line coupled between the signal driving and signal receiving circuits. The term "coupled" is used herein to express a direct connection as well as a connection through one or more intervening circuits or structures. The terms "exemplary" and "embodiment" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

What is claimed is:

1. A microprocessor comprising:
an instruction execution unit to execute processes having respective virtual address spaces;
a first set of process execution resources including at least a register file and a translation lookaside buffer;
a second set of process execution resources including at least a register file and a translation lookaside buffer;
context-switch circuitry that (i) is dedicated to background loading of context information into the first and second sets of prosecution resources, (ii) executes no host processes having respective virtual address spaces, and (iii) loads, without invoking instruction execution within the instruction execution unit, context information for a process to-be-executed by the instruction execution unit into the register file and translation lookaside buffer of either the first set or the second set of process execution resources during a first interval in which the instruction execution unit executes a current process and accesses context information for the current process within the register file and translation lookaside buffer of the other of the first set or the second set of process execution resources.

2. The microprocessor of claim 1 wherein the context-switch circuitry that loads context information for a process next-to-be-executed by the instruction execution unit into the register file and translation lookaside buffer of either the first set or the second set of process execution resources comprises (i) a dynamic random access memory (DRAM) controller to read and write data within a DRAM storage external to the microprocessor, and (ii) context-switch control logic to retrieve the context information for the process next-to-be executed from the DRAM storage via the DRAM controller.

3. The microprocessor of claim 2 wherein the context-switch control logic to retrieve the context information for the process next-to-be executed from the DRAM storage via the DRAM controller comprises circuitry to retrieve the context information for the process next-to-be executed from a first region of the DRAM storage reserved for storage of process-context information, and wherein a second region of the DRAM storage is reserved by the microprocessor as an off-microprocessor data cache.

4. The microprocessor of claim 2 wherein the context-switch circuitry is further to copy context information, during the first interval and for a process executed by the instruction execution unit prior to the current process, from the register file and translation lookaside buffer of the other of the first set or the second set of process execution resources into the DRAM storage via the DRAM controller.

5. The microprocessor of claim 1 wherein (i) the register file and the translation lookaside buffer included within the first set of process resources include first access ports to enable read and write access thereto, and (ii) the register file and the translation lookaside buffer included within the second set of process resources include second access ports to enable read and write access thereto, and wherein the context-switch circuitry comprises multiplexing circuitry to switchably couple the instruction execution unit to the first access ports prior to commencement of the first interval and to switchably decouple the instruction execution unit from the first access ports after the first interval transpires and switchably couple the instruction execution unit to the second access ports in preparation for execution of the next-to-be-executed process.

6. The microprocessor of claim 5 wherein the context-switch circuitry comprises logic to detect a miss in a data cache other than first-level caches within the first and second sets of process execution resources and, in response to detecting the miss, to reconfigure the multiplexer circuitry to decouple the instruction execution unit from the first access ports and to couple the instruction execution unit to the second access ports.

7. The microprocessor of claim 6 wherein the logic to detect the miss in the data cache other than the first-level caches comprises logic to detect a miss in a data cache within a dynamic random access memory (DRAM) external to the microprocessor.

8. The microprocessor of claim 7 further comprising circuitry to acquire data from a storage class memory in response to the miss in the data cache within the DRAM.

9. The microprocessor of claim 8 wherein time to acquire the data from the storage class memory in response to the miss in the data cache within the DRAM is one (1) microsecond or greater.

10. The microprocessor of claim 1 wherein (i) the first set of process execution resources further includes a first-level data cache and at least one of a second-level data cache or a third-level data cache, (ii) the second set of process execution resources further includes a first-level data cache and at least one of a second-level data cache or a third-level data cache, and (iii) the context-switch circuitry is further to load context information for the process next-to-be-executed into the at least one of the second-level data cache or the third-level data cache of either the first set or the second set of process execution resources during the first interval in which the instruction execution unit executes the current process and additionally accesses context information for the current process within the at least one of the second-level data cache or the third level-data cache of the other of the first set or the second set of process execution resources.

11. A method of operation within a microprocessor having (i) an instruction execution unit to execute processes having respective virtual address spaces, first and second sets of process execution resources, and (iii) context-switch circuitry dedicated to background loading of context information into the first and second sets of prosecution resources and that executes no host processes having respective virtual address spaces, the method comprising:

execquting a context load operation within the context-switch circuitry, during a first interval and without invoking instruction execution within the instruction execution unit, to load context information for a process next-to-be-executed by the instruction execution unit into a register file and translation lookaside buffer of either the first set or the second set of process execution resources; and during the first interval and concurrently with the loading of the context information for the process next-to-be executed, executing a current process within the instruction execution unit, including accessing context information for the current process within the register file and translation lookaside buffer of the other of the first set or the second set of process execution resources.

12. The method of claim 11 wherein executing the context load operation within the context-switch circuitry to loading the context information for the process next-to-be-executed by the instruction execution unit into the register file and translation lookaside buffer of either the first set or the second set of process execution resources comprises outputting, from the context-switch circuitry, one or more memory-access instructions to retrieve the context information for the process next-to-be executed from a dynamic random access memory (DRAM) storage external to the microprocessor.

13. The method of claim 12 wherein outputting, from the context-switch circuitry, one or more memory-access instructions to retrieve the context information for the process next-to-be executed from the DRAM storage comprises outputting, from the context-switch circuitry, one or more memory-access instructions to retrieve the context information for the process next-to-be executed from a first region of the DRAM storage reserved for storage of process-context information, and wherein a second region of the DRAM storage is reserved as an off-chip data cache for the microprocessor.

14. The method of claim 12 further comprising outputting, from the context-switch circuitry, one or more memory-access instructions to copy context information, during the first interval and for a process executed by the instruction execution unit prior to the current process, from the register file and translation lookaside buffer of the other of the first set or the second set of process execution resources into the DRAM storage.

15. The method of claim 11 wherein (i) the register file and the translation lookaside buffer included within the first set of process resources include first access ports to enable read and write access thereto, and (ii) the register file and the translation lookaside buffer included within the second set of process resources include second access ports to enable read and write access thereto, the method further comprising switchably coupling the instruction execution unit to the first access ports prior to commencement of the first interval and, after the first interval transpires switchably decoupling the instruction execution unit from the first access ports and switchably coupling the instruction execution unit to the second access ports in preparation for execution of the next-to-be-executed process.

16. The method of claim 15 further comprising detecting a miss in a data cache other than first-level caches within the first and second sets of process execution resources and, in response to detecting the miss, decoupling the instruction execution unit from the first access ports and coupling the instruction execution unit to the second access ports.

17. The method of claim 16 wherein detecting the miss in the data cache other than the first-level caches comprises detecting a miss in a data cache within a dynamic random access memory (DRAM) external to the microprocessor.

18. The method of claim 17 further comprising acquiring data from a storage class memory in response to the miss in the data cache within the DRAM.

19. The method of claim 18 wherein time to acquire the data from the storage class memory in response to the miss in the data cache within the DRAM is one (1) microsecond or greater.

20. The method of claim 11 wherein the first set of process execution resources further includes a first-level data cache and at least one of a second-level data cache or a third-level data cache, and the second set of process execution resources further includes a first-level data cache and at least one of a second-level data cache or a third-level data cache, the method further comprising loading, as part of the context load operation executed within the context-switch circuitry, context information for the process next-to-be-executed into the at least one of the second-level data cache or the third-level data cache of either the first set or the second set of process execution resources during the first interval in which the instruction execution unit executes the current process and additionally accesses context information for the current process within the at least one of the second-level data cache or the third level-data cache of the other of the first set or the second set of process execution resources.

21. A microprocessor comprising
a first set of process execution resources including at least a register file and a translation lookaside buffer;
a second set of process execution resources including at least a register file and a translation lookaside buffer;
an instruction execution unit to execute processes having respective virtual address spaces, including execution of constituent instructions of a current process during a first interval, the instruction execution unit including means for accessing context information for the current process within the register file and translation lookaside buffer of either of the first set or the second set of process execution resources; and
context-switch circuitry dedicated to background loading of context information into the first and second sets of prosecution resources and that executes no host processes having respective virtual address spaces, the context-switch circuitry including means for loading, during the first interval and without invoking instruction execution within the instruction execution unit, context information for a next-to-be-executed process into the register file and translation lookaside buffer of the other of the first set or the second set of process execution resources.

\* \* \* \* \*